(12) United States Patent  
Stebbings

(10) Patent No.: US 7,019,306 B2  
(45) Date of Patent: Mar. 28, 2006

(54) FLAME SENSOR

(75) Inventor: Keith R. Stebbings, Bradford, NH (US)

(73) Assignee: Ametek, Inc., Paoli, PA (US)

( * ) Notice: Subject to any disclaimer, the term of this patent is extended or adjusted under 35 U.S.C. 154(b) by 51 days.

(21) Appl. No.: 10/611,384

(22) Filed: Jul. 1, 2003

(65) Prior Publication Data

US 2004/0257234 A1    Dec. 23, 2004

Related U.S. Application Data

(60) Provisional application No. 60/431,819, filed on Dec. 9, 2002.

(51) Int. Cl.  
*G08B 17/12* (2006.01)

(52) U.S. Cl. ..................... 250/372

(58) Field of Classification Search ........... 250/372, 250/554  
See application file for complete search history.

(56) References Cited

U.S. PATENT DOCUMENTS

| | | | |
|---|---|---|---|
| 3,689,773 A * | 9/1972 | Wheeler | 250/554 |
| 5,264,708 A | 11/1993 | Hijikata | 250/554 |
| 5,995,261 A | 11/1999 | Asous | 359/163 |
| 6,013,919 A * | 1/2000 | Schneider et al. | 250/554 |
| 2002/0154592 A1 | 10/2002 | Tanaka et al. | 369/121 |

FOREIGN PATENT DOCUMENTS

| | | |
|---|---|---|
| EP | 0 558 766 A1 | 9/1992 |
| EP | 0 588 766 B1 | 9/1992 |
| EP | 0 942 232 A2 | 3/1999 |

* cited by examiner

*Primary Examiner*—David Porta  
*Assistant Examiner*—Marcus Taningco  
(74) *Attorney, Agent, or Firm*—Hayes Soloway P.C.

(57) ABSTRACT

A UV flame sensor is formed on a multilayer printed circuit board. The circuitry of the sensor includes a photodiode for detecting an input signal, an amplifier for amplifying the input signal, a FET for providing automatic gain control, and at least one capacitor for providing stability to the output signal of the amplifier. The capacitor is formed from a capacitance laminate buried in the PCB. Furthermore, the PCB is designed so that there are guard bands disposed on each layer of the PCB at identical positions, and tracks of equal potential disposed in identical locations on the interior layers of the PCB. These guard bands and tracks are identically shaped. A method of producing the flame sensor is also described.

17 Claims, 17 Drawing Sheets

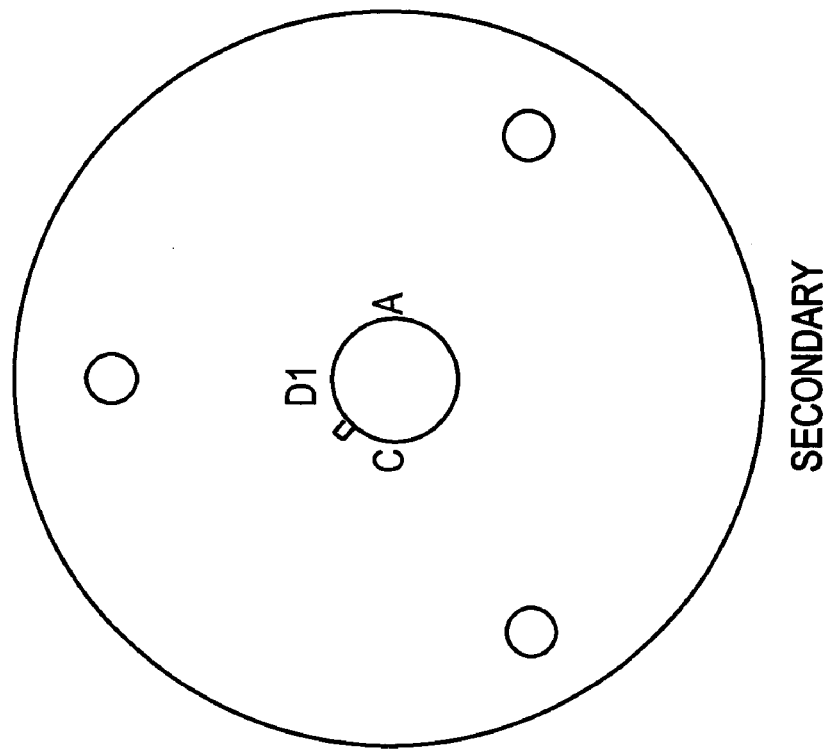
FIG. 4b SECONDARY
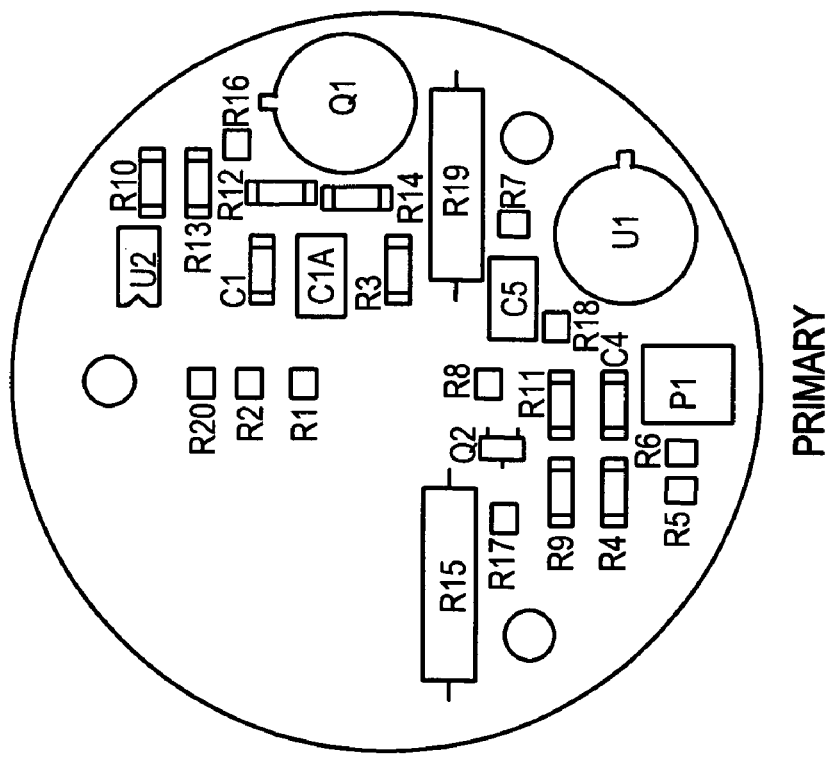
FIG. 4a PRIMARY

SECONDARY SIDE

PRIMARY SIDE

FLAME SENSOR

CROSS-REFERENCE TO RELATED APPLICATION

This Application is related to co-pending U.S. Provisional Patent Application entitled "Flame Sensor" filed on Dec. 9, 2002 and accorded the Ser. No. 60/431,819, which is entirely incorporated herein by reference.

FIELD OF THE INVENTION

The present invention is generally related to a device and method for detecting flames.

BACKGROUND OF THE INVENTION

Most fire detection technology for detecting the presence of a flame of burning hydrocarbon fuel focuses on detecting heat, smoke (particle matter) or flame (light), i.e., the three major characteristics of fire. All of these characteristics also have benign sources other than fire, such as heat from steam pipes, particle matter from aerosols, and light from the sun. Other factors further confound the process of fire detection by masking the characteristic of interest, such as air temperature, and air movement. In addition, smoke and heat from fires can dissipate too rapidly or accumulate too slowly for effective detection. In contrast, because flame sensors are optical devices, they can respond to flames in less than a second.

In an exemplary application, the flame of burning hydrocarbon fuel is the augmentor flame (afterburner pilot flame) in a gas turbine engine, the loss of which requires an automatic engine control to prevent fuel flow to the afterburner; otherwise, dangerous fuel levels can accumulate within seconds of the turbine engine losing its ignition flame. Failure can result in an overpressure condition leading to engine damage. In this scenario, an optical flame sensor is adapted to transmit a flameout condition, which quickly alerts the engine control system to make critical adjustments, e.g., adjusting fuel flow to prevent a potentially catastrophic situation.

Optical flame sensors can detect infrared (IR), Ultraviolet (UV), or a combination of UV and IR radiation. A UV flame sensor typically detects radiation emitted in the 200 to 400 nm range. Optical sensing devices incorporating a UV detector to sense the presence of the augmentor flame in gas turbine engines sense UV radiation emitted from the augmentor flame against the background of hot metal, in a high temperature environment and under heavy vibration.

Disadvantages of UV flame sensors known in the art include the presence of leakage currents and/or parasitic capacitances for a necessary feedback capacitance in the pre-amplifier stage coupled with an inability to survive high temperature operating conditions. For example, not all capacitors that feature a low dissipation factor are rated for high temperature environments. Also, high temperatures can cause preamplifier input offset errors. Moreover, many UV flame sensors suffer from an insufficient sensitivity to low levels of UV light, due to losses at various components, e.g., the Printed Circuit Board (PCB), feedback capacitor, and amplifier inputs.

SUMMARY OF THE INVENTION

The present invention provides a UV flame sensor that receives optical energy within the UV spectrum and outputs an analog signal proportionate to the intensity of the optical energy detected, permits operability in high-temperature environments (125° C. and higher), and is sensitive to low levels of UV light.

By way of example, a flame sensor consistent with the present invention comprises a housing with associated lensing, electronic circuitry, and an electrical connector. In one embodiment, a flame sensor consistent with the present invention employs a buried capacitance laminate within the PCB to achieve the lowest possible leakage current losses for a necessary feedback capacitance in the pre-amplifier stage. A flame sensor consistent with the present invention employs a PCB routing having carefully-placed tracks, guard bands and ground planes to reduce parasitic capacitance and leakage currents. If desired, a FET may be employed in the pre-amplifier stage for automatic gain control for high signal levels.

BRIEF DESCRIPTION OF THE DRAWINGS

FIG. 4 illustrates an exemplary PCB layout of the detector board of FIG. 3;

DETAILED DESCRIPTION OF THE EMBODIMENTS

Figure 1:
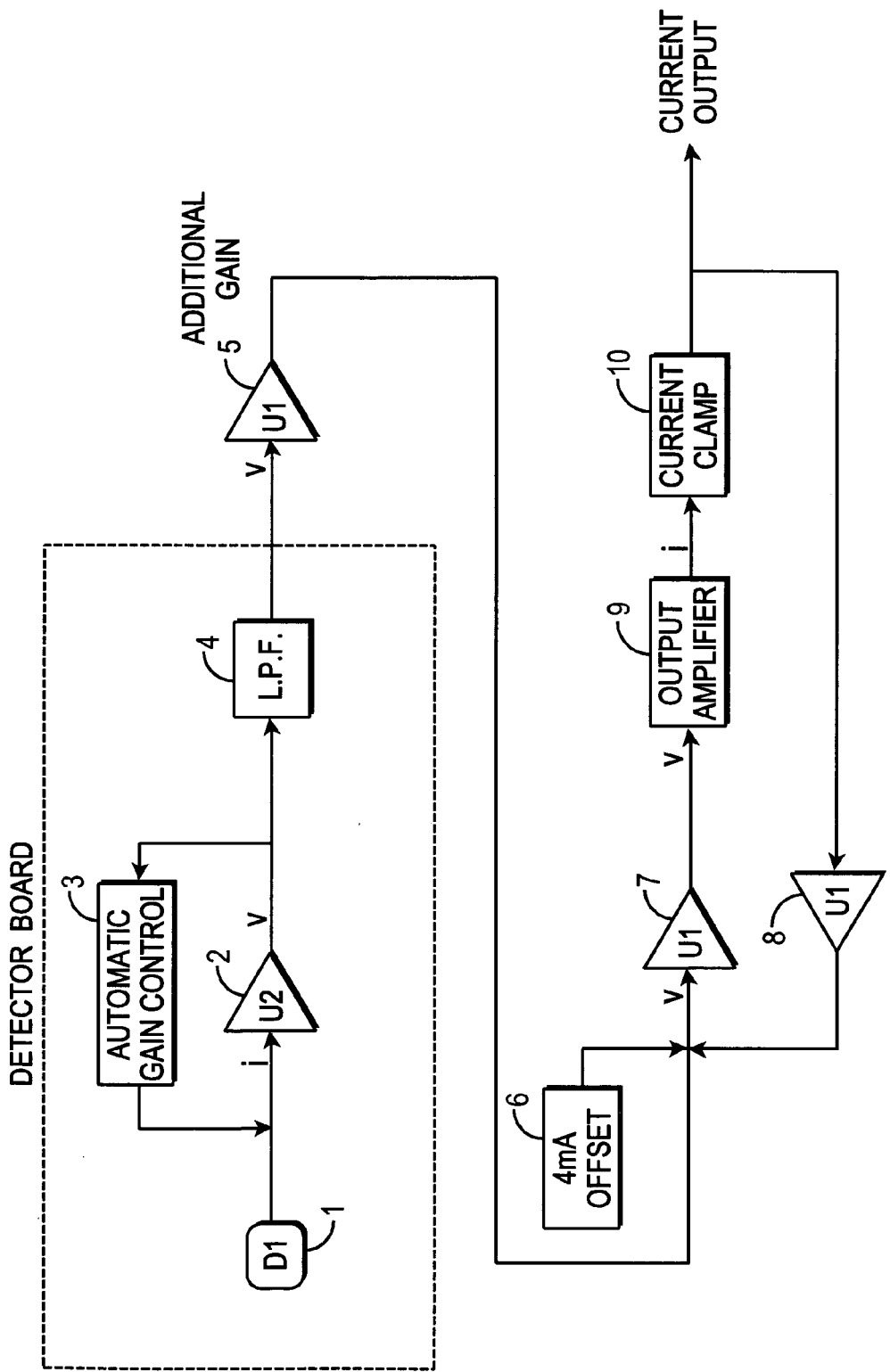
FIG. 1 is a functional block diagram depicting an exemplary detector board and output board consistent with the present invention.
Figure 2:
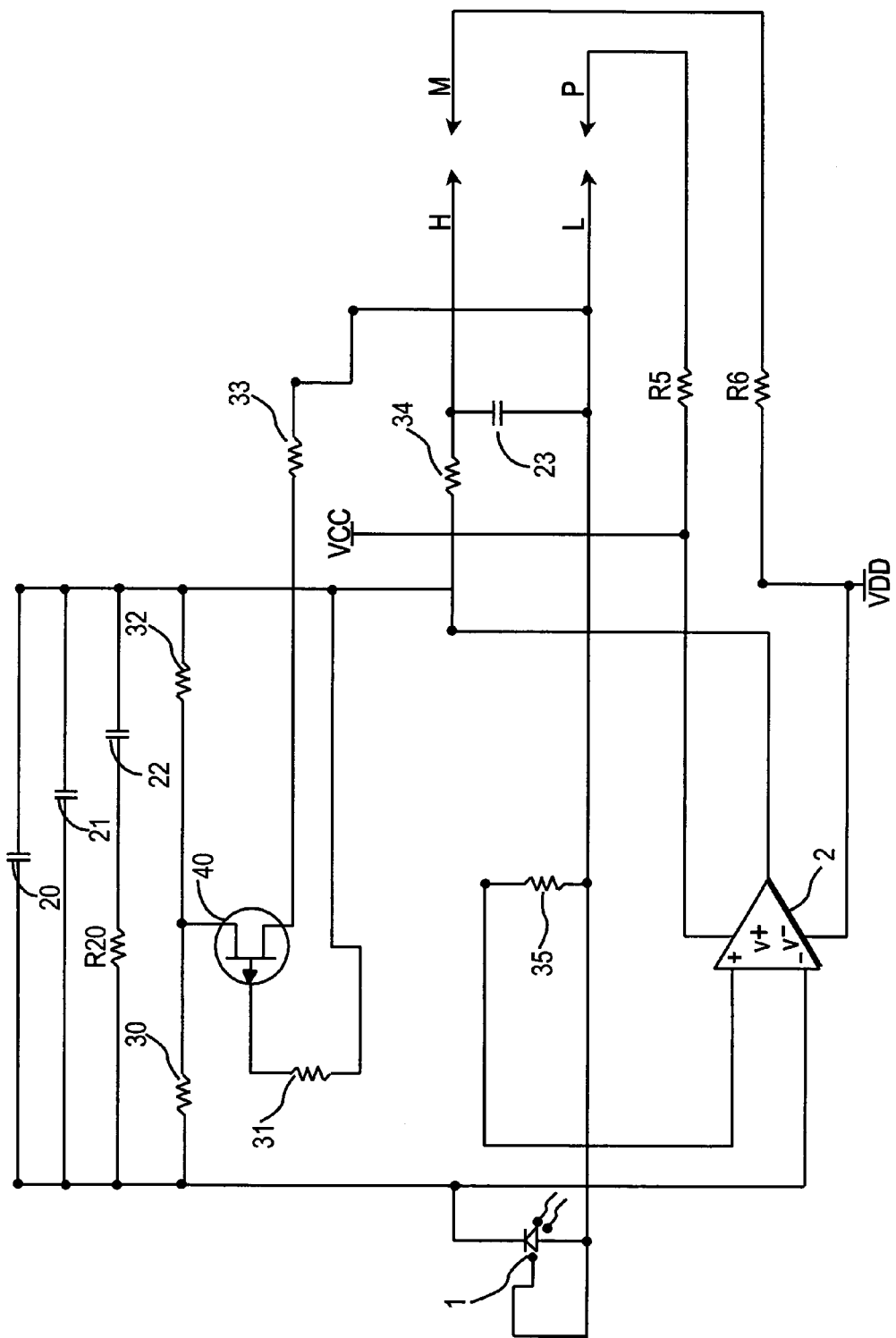
FIG. 2 is a schematic illustrating of an exemplary detector board consistent with the present invention.

With reference now to FIGS. 1 and 2, in one embodiment, a flame sensor consistent with the present invention comprises a housing with associated lensing, electronic circuitry, and an electrical connector. The electronic circuitry comprises two PCBs: a detector board and an output board.

The detector board employs a photodiode 1 to detect the presence of light within the UV spectrum and convert such optical energy into an analog signal proportionate to the intensity of the optical energy detected. As shown in FIG. 2, the photodiode is connected to both a virtual ground and the inverting input of operational amplifier 2.

Amplifier 2 both amplifies the signal received by the photodiode and changes the current signal output of the photodiode into a voltage signal. The output of the amplifier 2 is connected to the devices that provide the automatic gain control 3, capacitors 20, 21, and 22, which stabilize the signal output from the amplifier 2, and resistor 34 and capacitor 23, which form a low pass filter 4 to reduce the occurrence of noise in the signal output by the detector board.

The automatic gain control devices 3 form a feedback loop from the amplifier 2 output to the amplifier 2 input, and include a transistor 40, and resistors 30, 31, 32 and 33. When transistor 40 is on, the circuit provides the highest amount of possible gain to the signal from photodiode 1. Likewise, when the transistor is off, the lowest amount of gain to this signal is provided.

Figure 7:
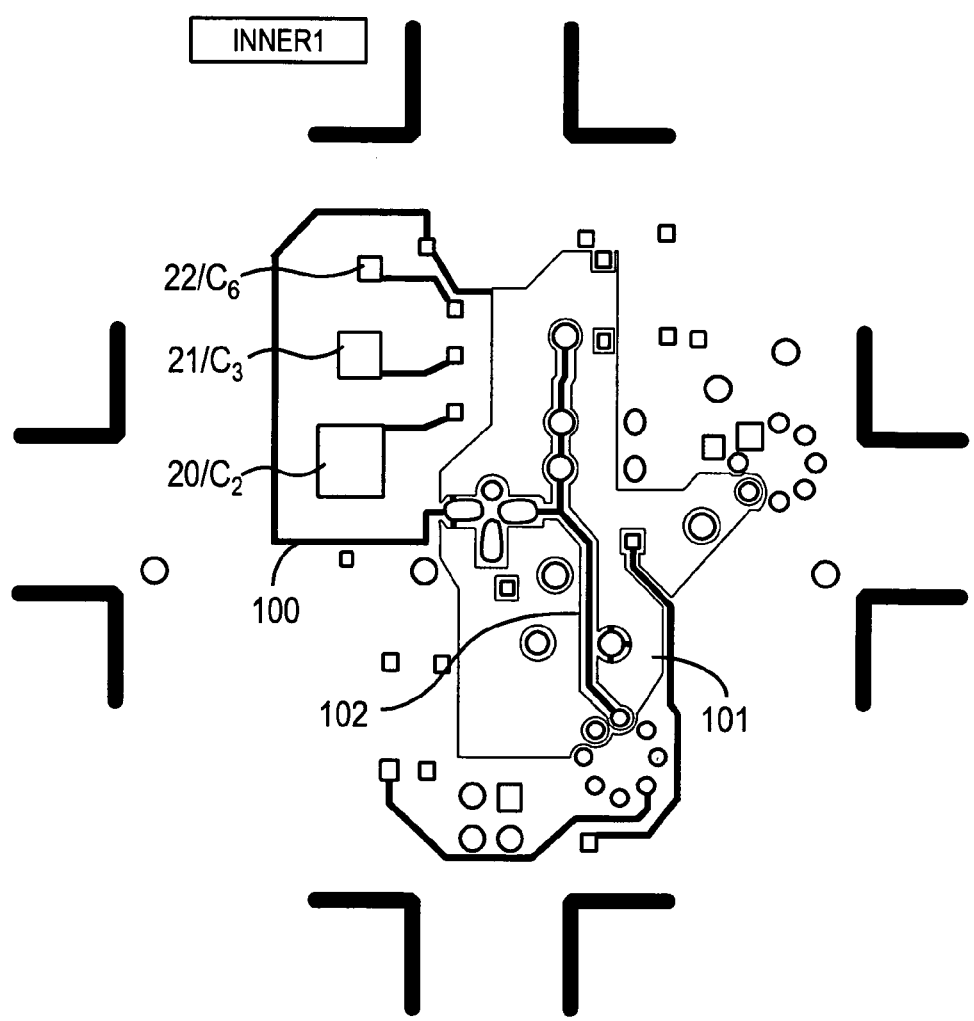
FIG. 7 is a wiring diagram illustrating the second layer of the exemplary multilayer PCB corresponding to the layout of FIG. 5.
Figure 8:
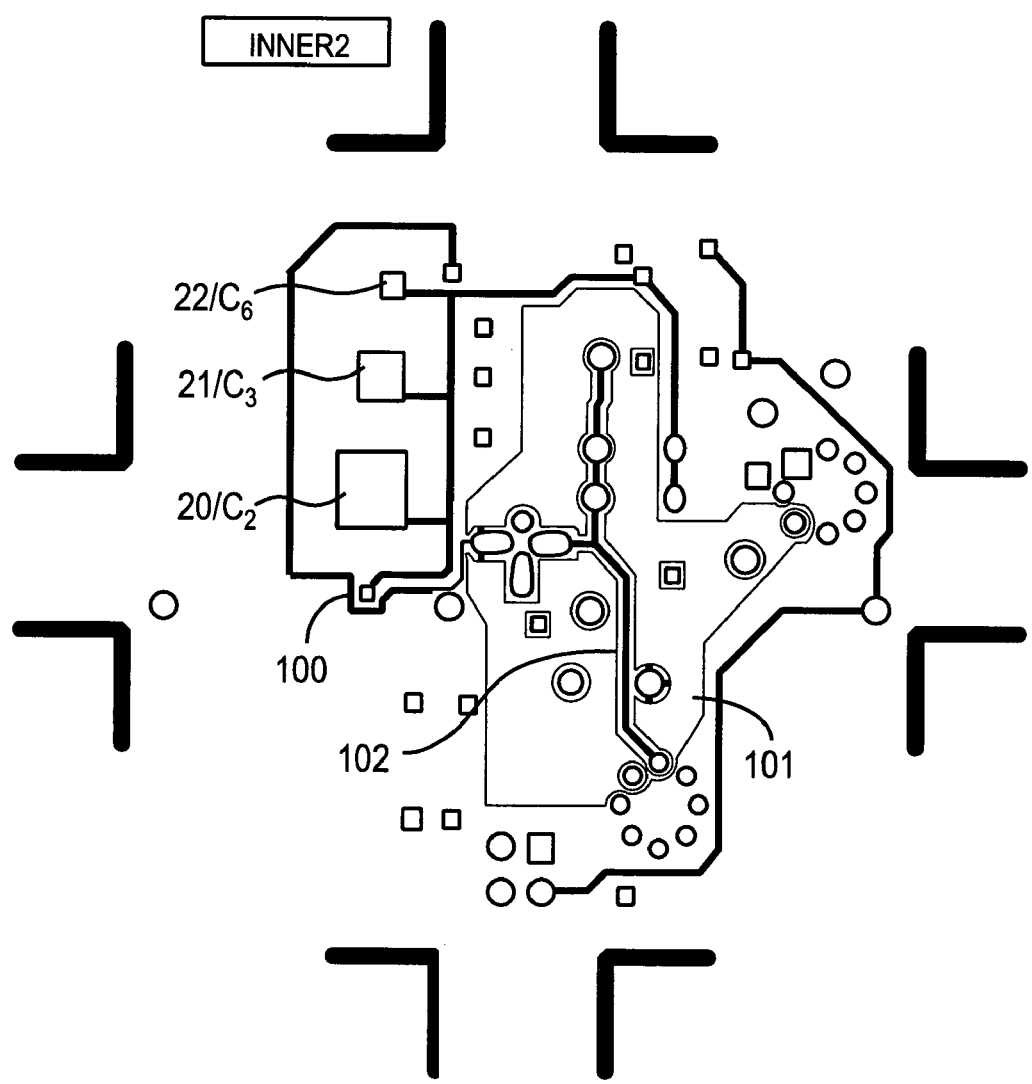
FIG. 8 is a wiring diagram illustrating the third layer of the exemplary multilayer PCB corresponding to the layout of FIG. 5.
Figure 9:
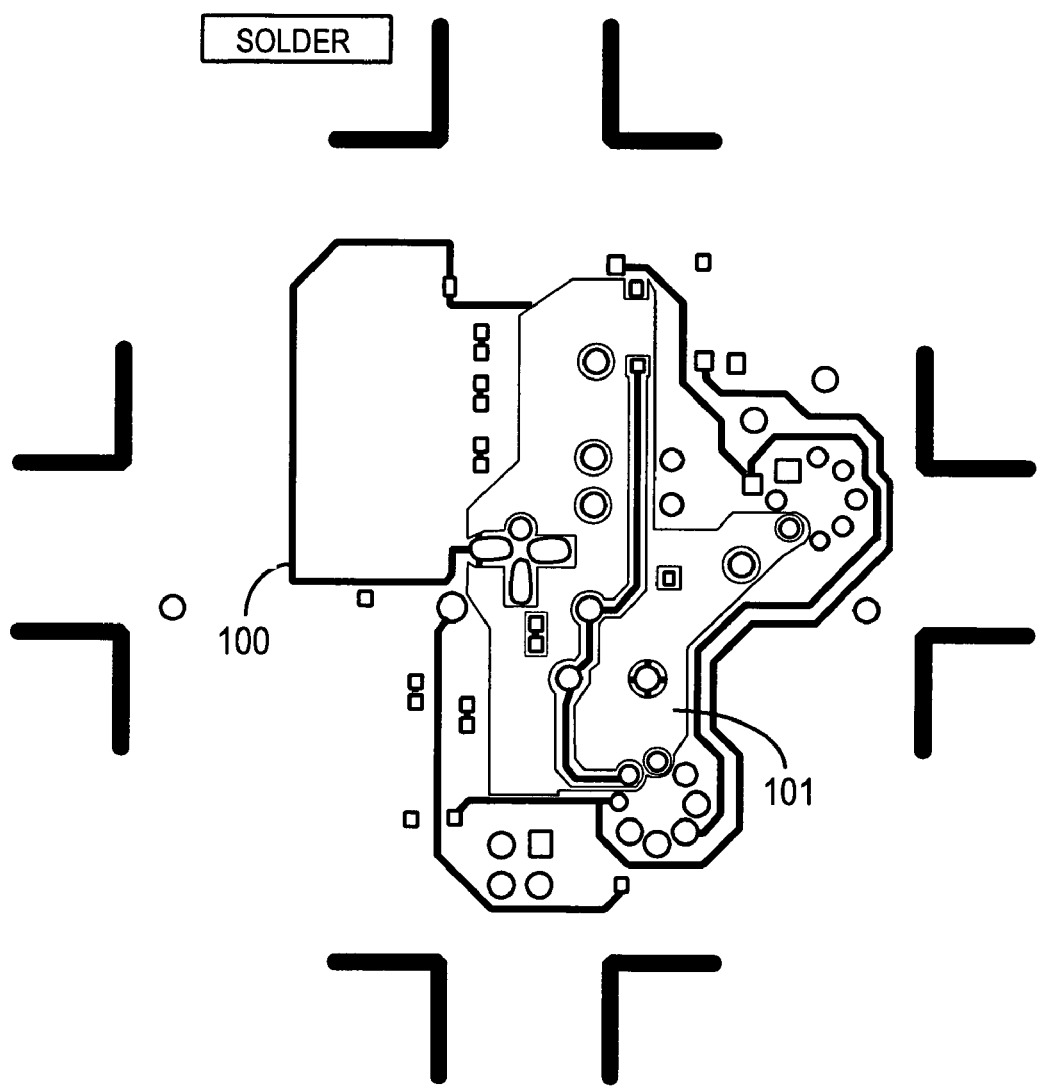
FIG. 9 is a wiring diagram illustrating the bottom layer of the exemplary multilayer PCB corresponding to the layout of FIG. 5.
Figure 10:
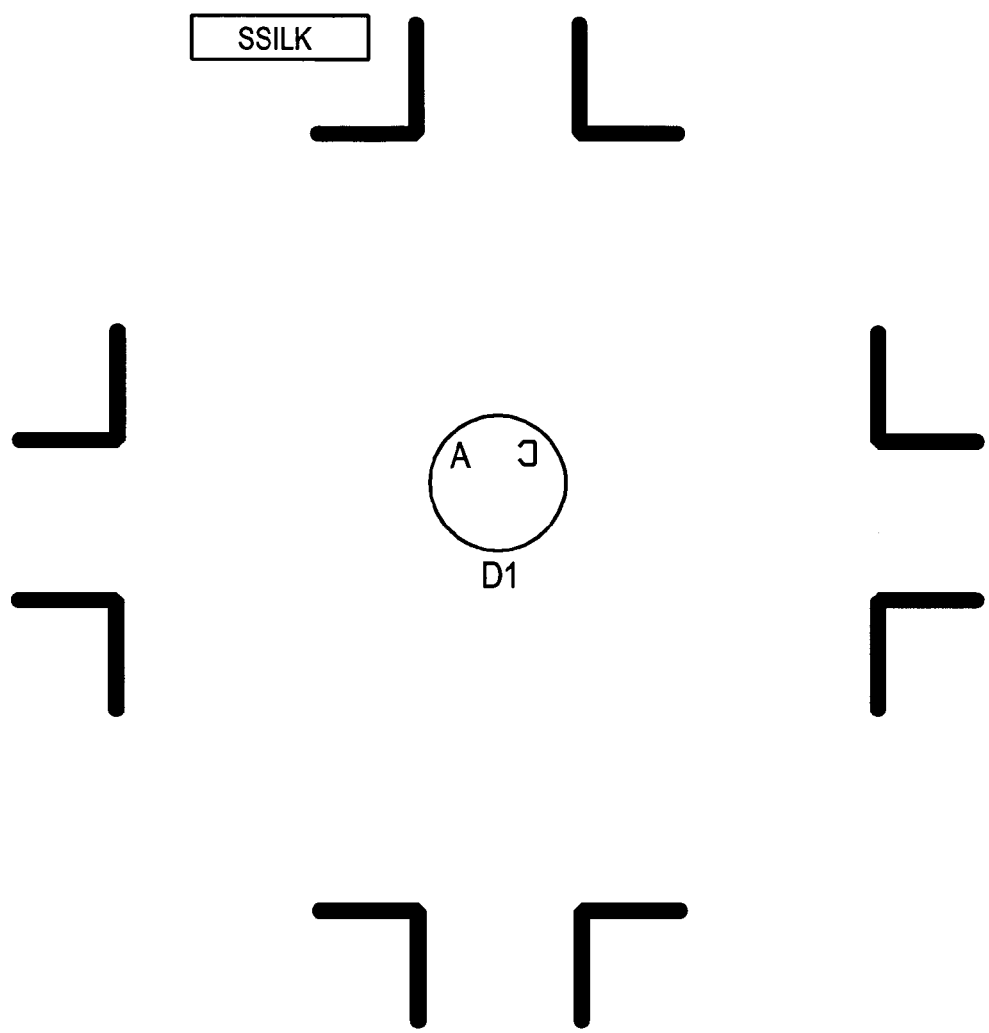
FIG. 10 is a layout diagram illustrating the layout of the photodiode on the bottom of the detector board in the exemplary multilayer PCB corresponding to the layout of FIG. 5.
Figure 11:
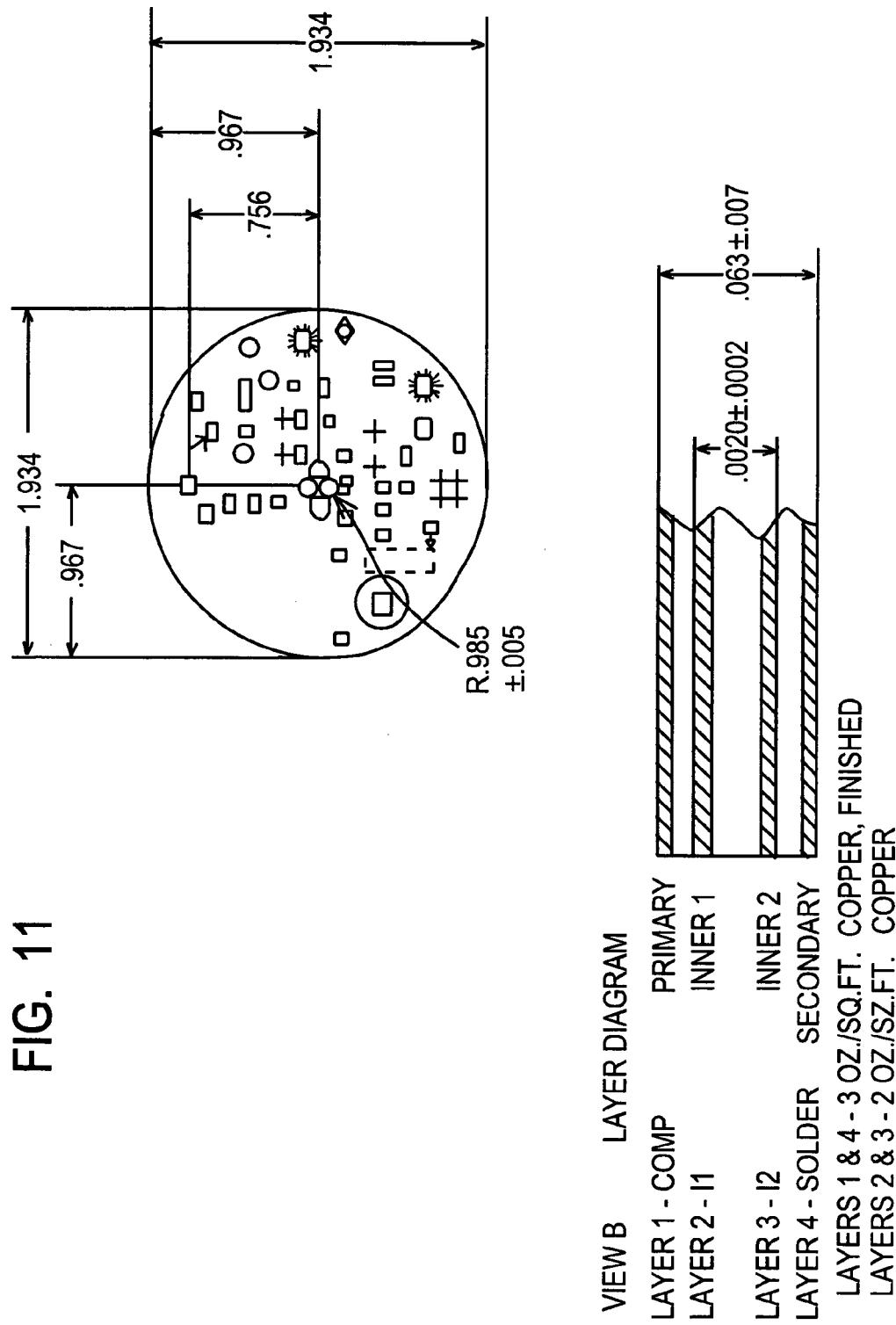
FIG. 11 is an exemplary design specification for the detector board in the exemplary multilayer PCB corresponding to the layout of FIG. 5.

Capacitors 20, 21, and 22 provide stability to the signal output of amplifier 2. These capacitors are formed from a buried capacitance laminate positioned on the inner layers of a multilayer PCB, e.g., as shown in FIGS. 7 and 8, and together with the placement of guard bands on each of the layers, allow the PCB to achieve the lowest possible leakage current losses for a necessary feedback capacitance in the Pre-Amplifier stage of the circuit, e.g., as shown in FIG. 2. Primarily, these embedded capacitors allow a flame sensor consistent with the instant invention to operate at temperatures for which other types of capacitors with low dissipation factor are not rated.

The layout of the PCB in the instant invention provides several advantages, namely, with respect to the placement of the guard bands 100, the ground planes 101, and the tracks 102. The guard bands are placed in identical positions on each of the layers, and tracks of equal potential are exactly mimicked on the inner layers of the PCB. Thus, the placement of these elements with respect to the various layers, shown in FIGS. 6, 7, 8, and 9, allows the PCB to minimize any leakage current and to insure that negligible amounts of additional capacitance are introduced into the circuitry.

Figure 12:
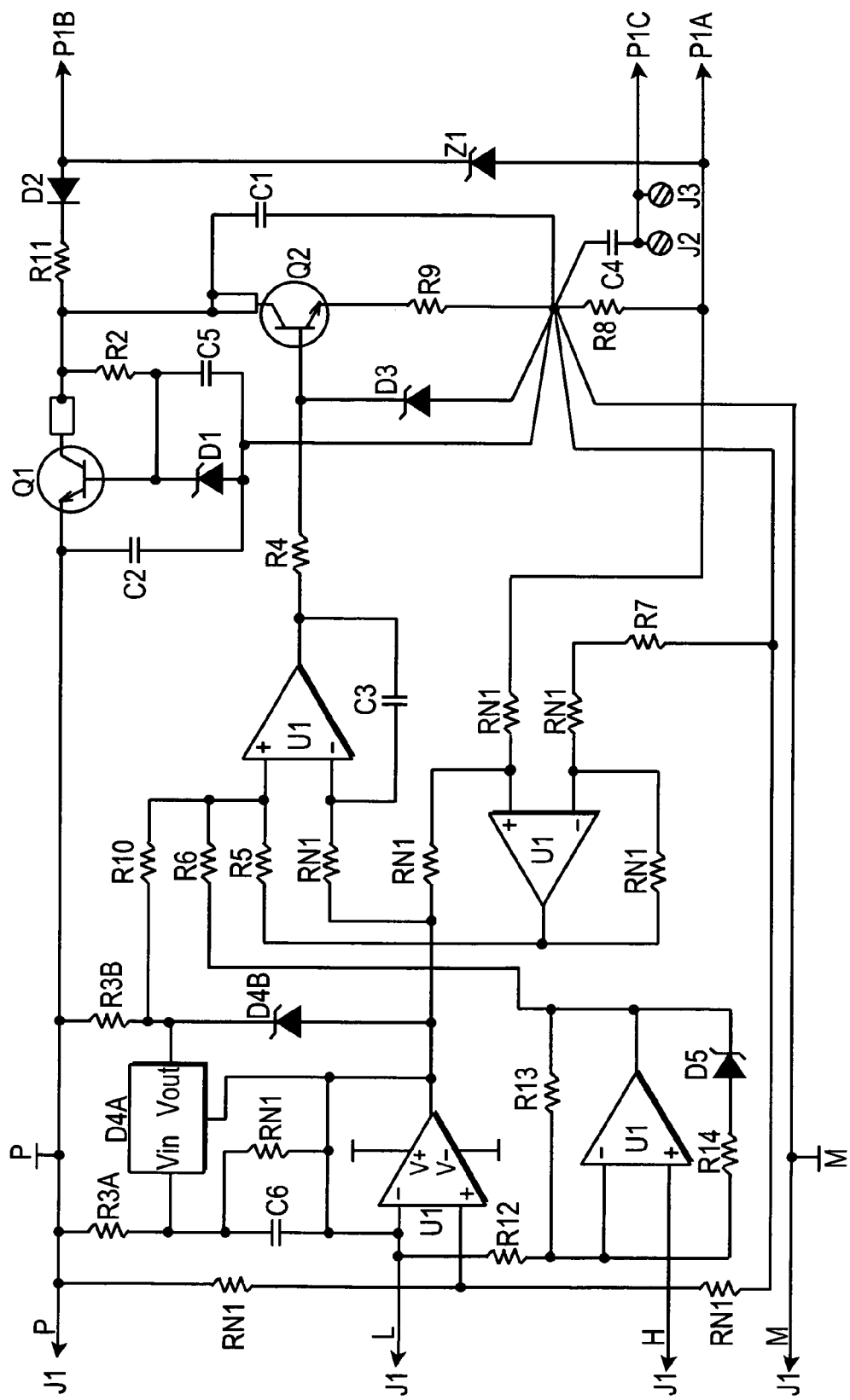
FIG. 12 is a schematic illustrating an exemplary output board assembly consistent with the present invention.
Figure 13B:
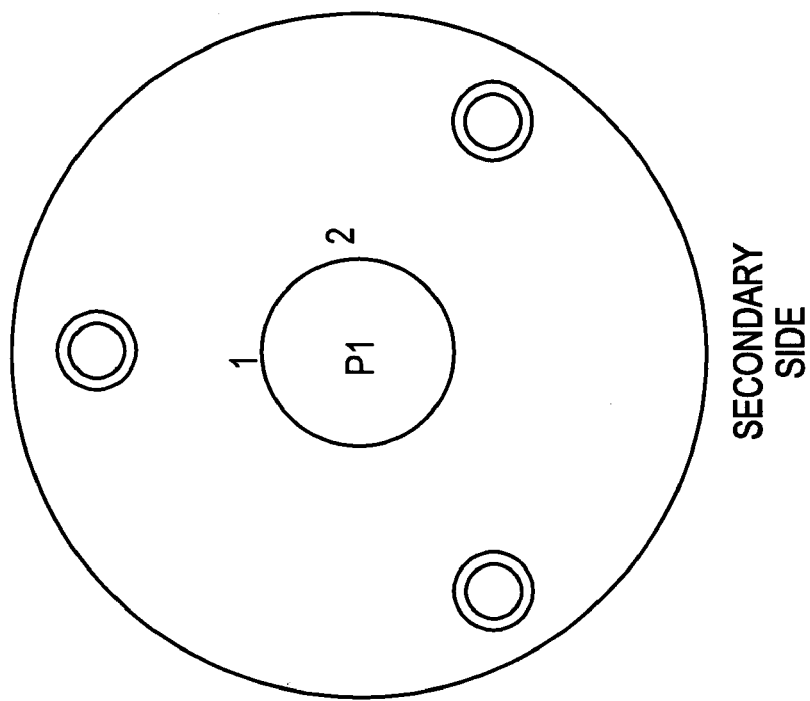
FIG. 13 is an exemplary PCB layout of the output board assembly of FIG. 12.
Figure 13A:
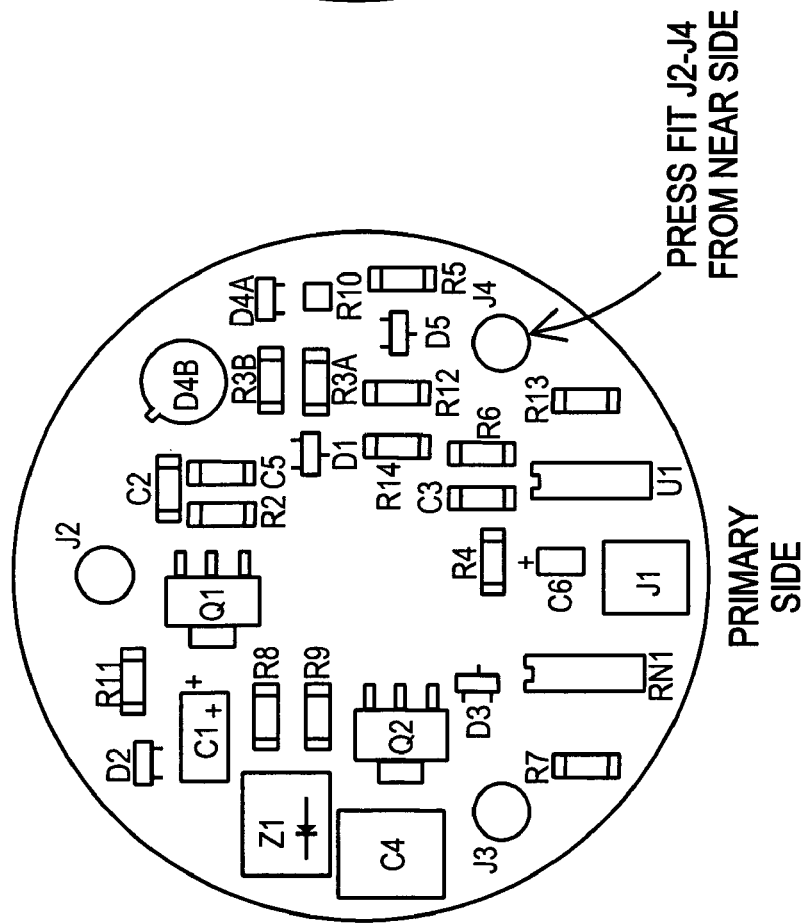
Figure 14:
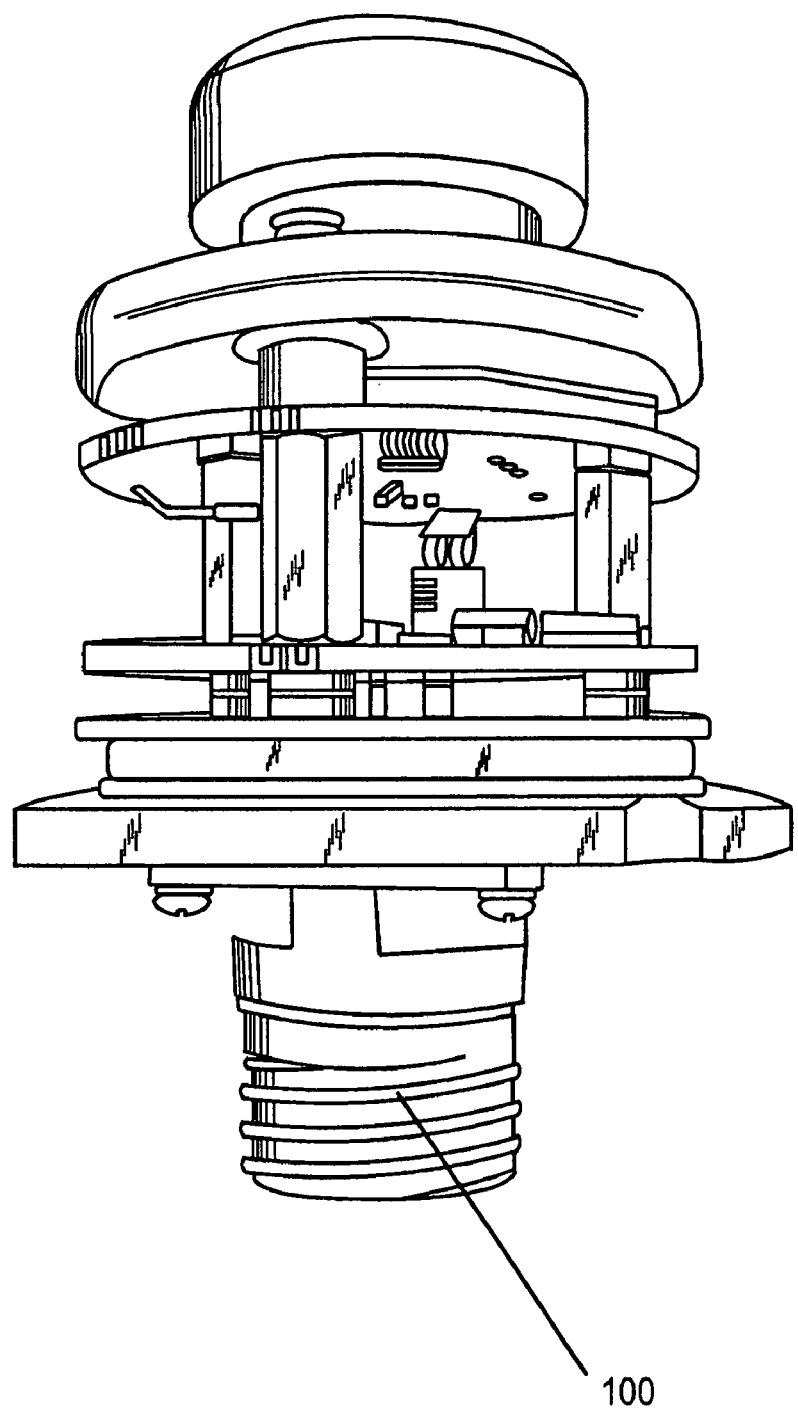
FIGS. 14–17 are exemplary views of a flame sensor assembly consistent with the invention, including housing, circuitry, and electrical connector.
Figure 15:
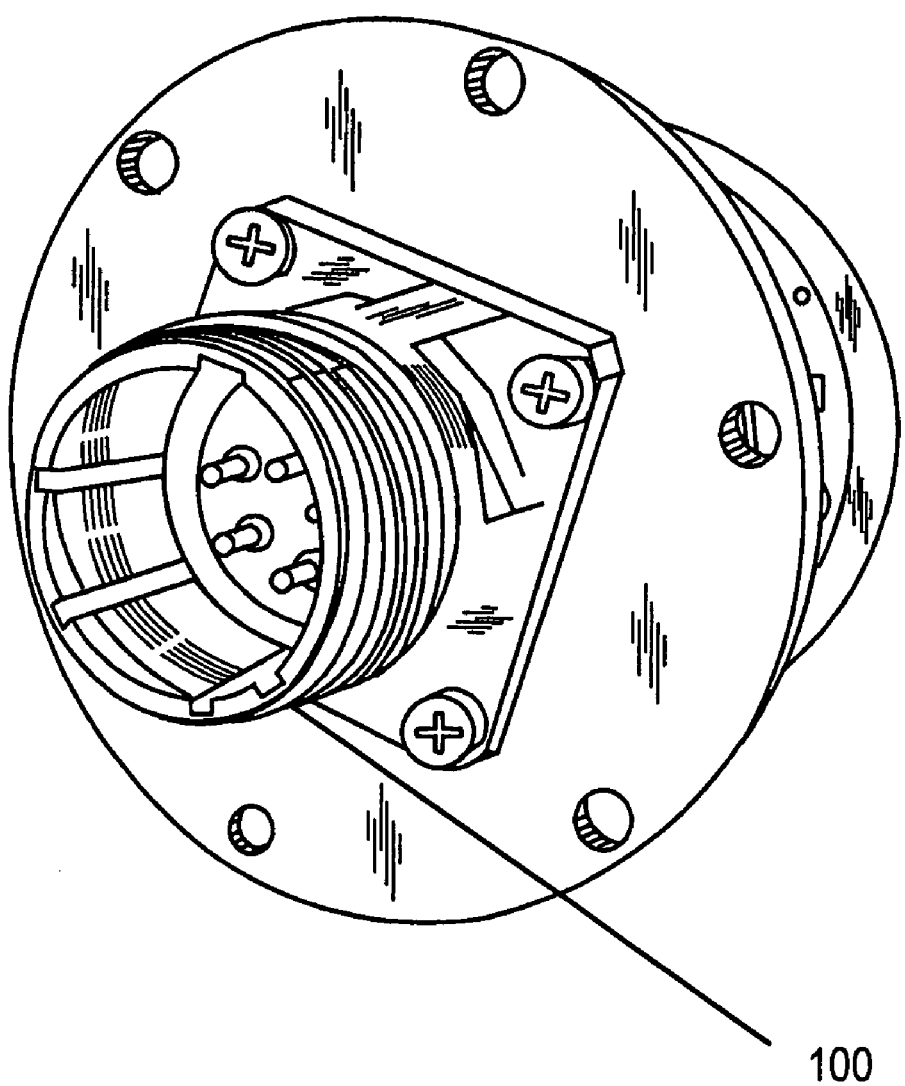
Figure 16:
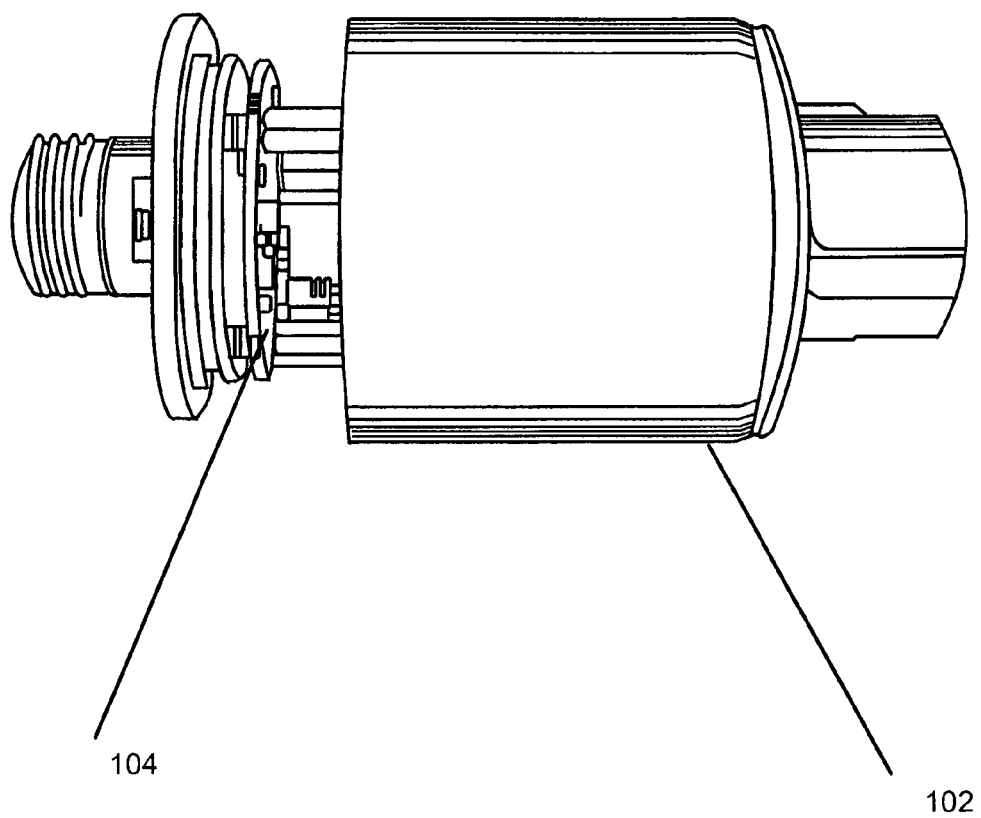
Figure 17:
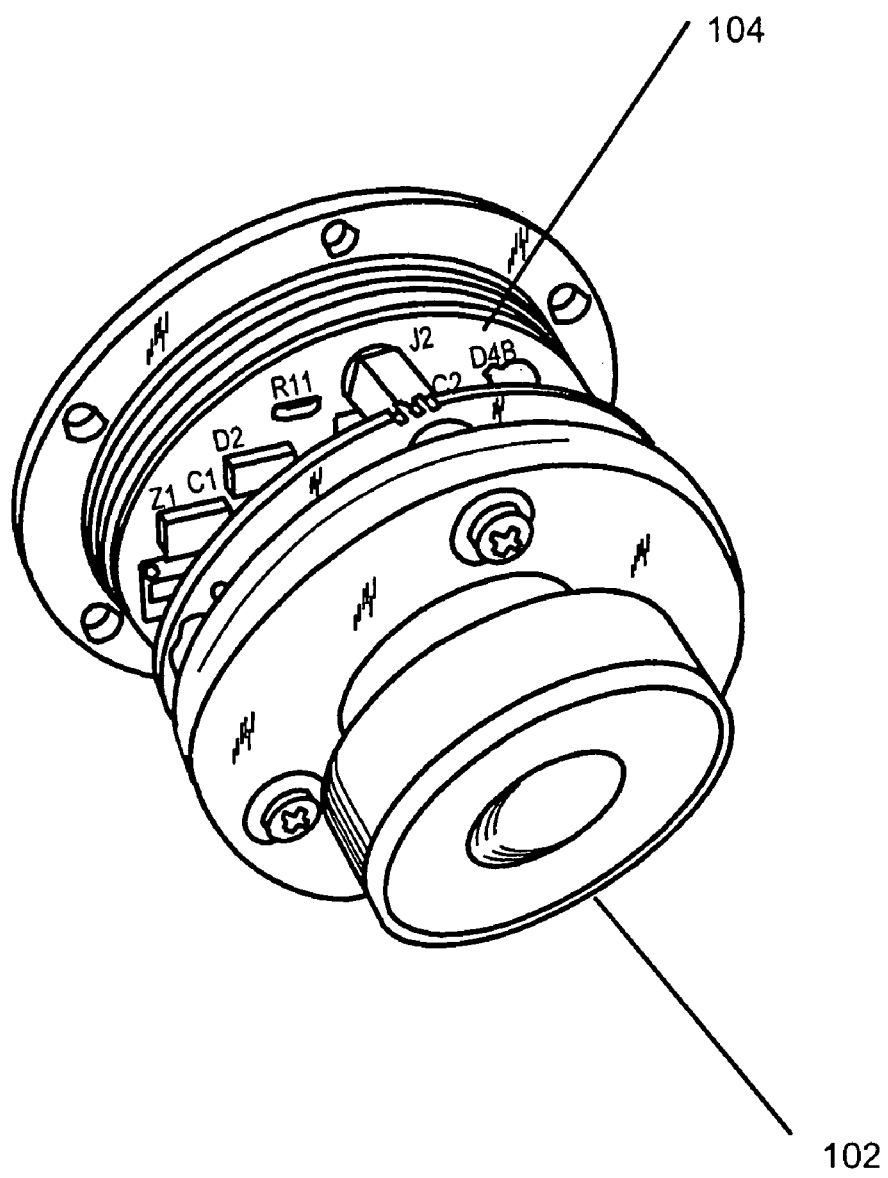

FIGS. 1, 12, and 13 illustrate an exemplary output board.

Figure 3:
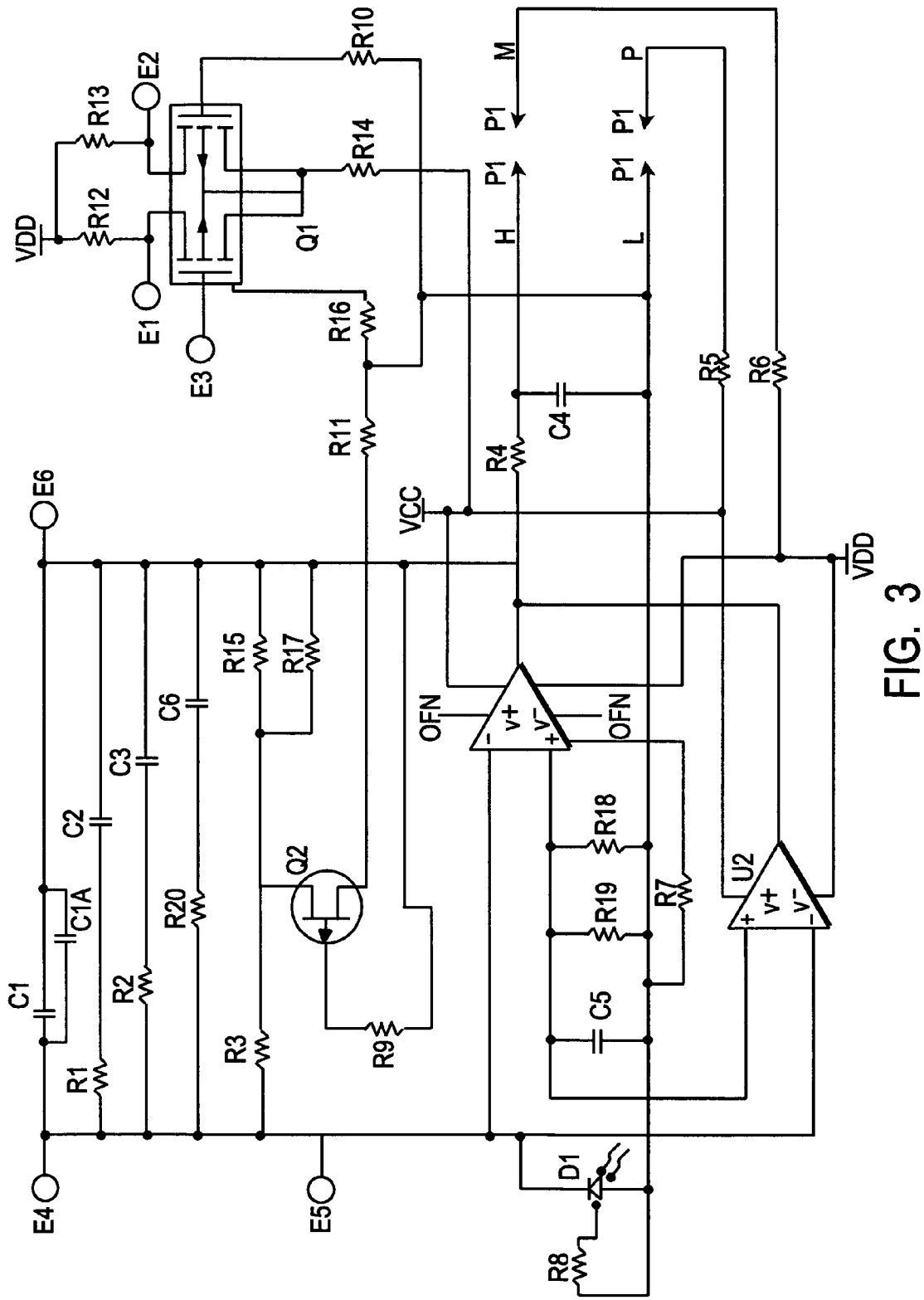
FIG. 3 is a schematic illustrating an alternative embodiment of a detector board consistent with the present invention.
Figure 5:
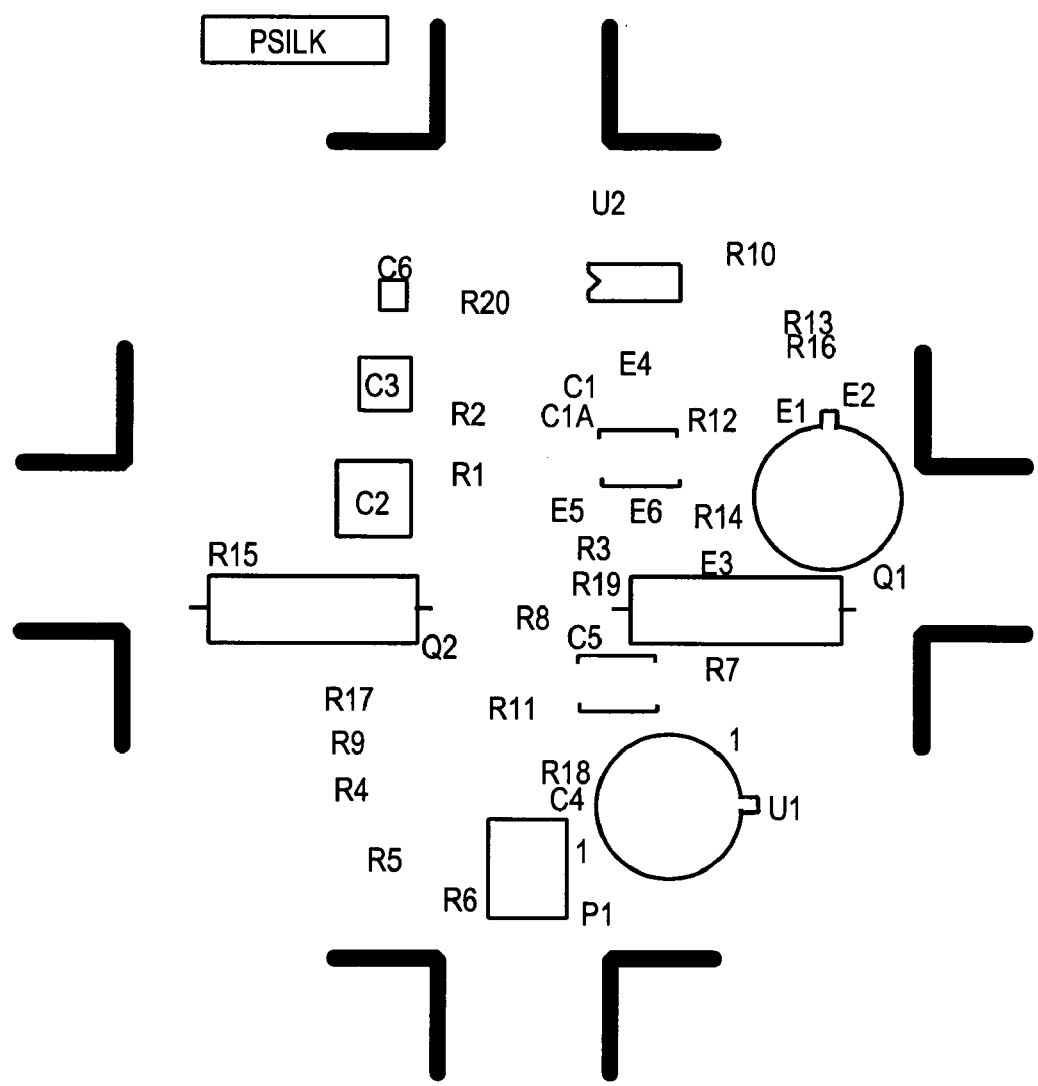
FIG. 5 is another illustration of the exemplary PCB layout of the detector board of FIG. 3.
Figure 6:
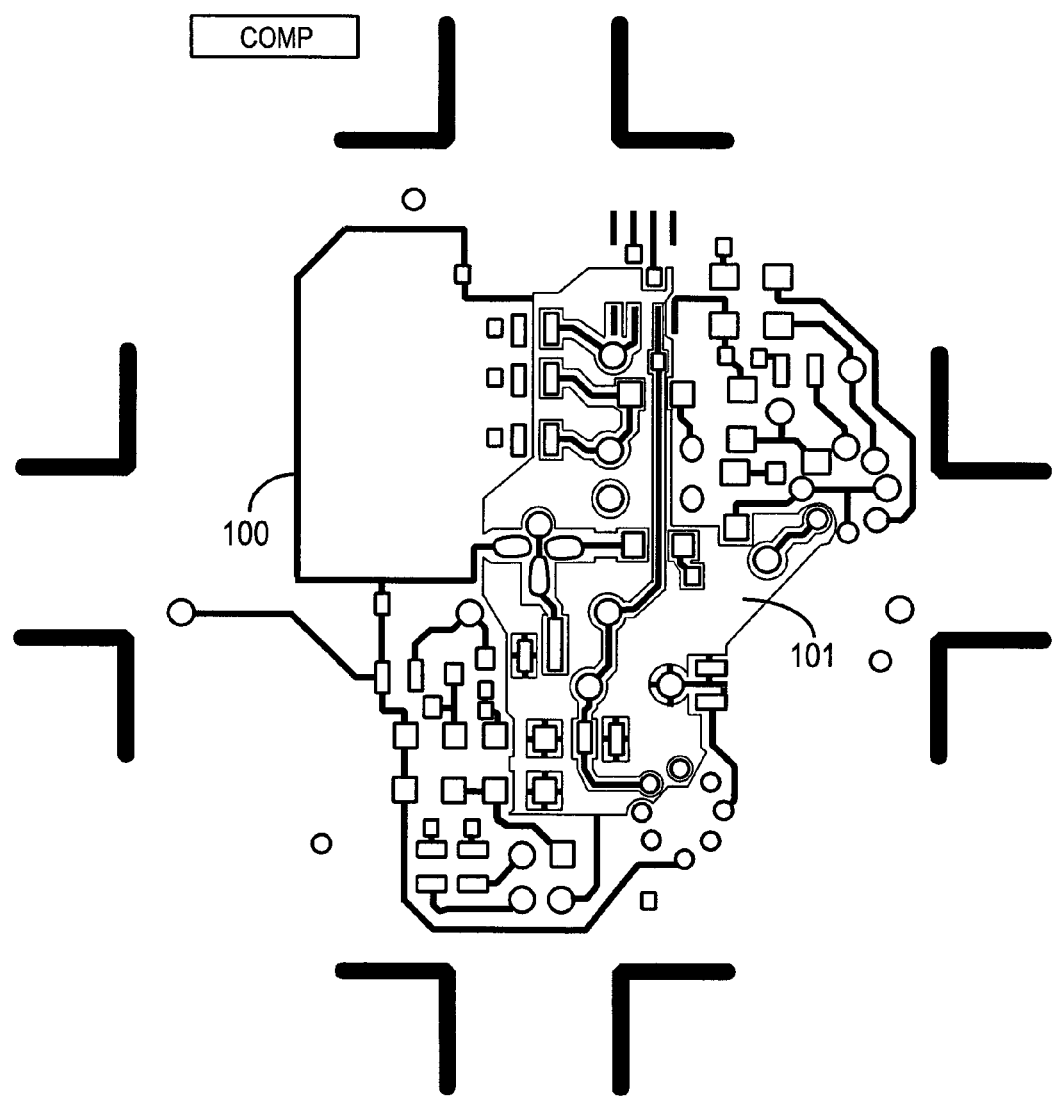
FIG. 6 is a wiring diagram illustrating the top layer of the exemplary multilayer PCB corresponding to the layout of FIG. 5.

FIGS. 3, 4, and 5 illustrate other exemplary embodiments of the detector board circuit and layout, and allow for the addition of the elements marked with an asterisk to additionally aid in compensating for any output errors in the circuit.

The exemplary embodiments described above and illustrated in the Figures allow for performance enhancements not found in the prior art. First, the sensor can operate in temperatures as high as 125 degrees Celsius, and is highly sensitive to low levels of UV. While high heat may cause a change in the output of the op-amp, the selection of a low offset op-amp, compensation networks at the input of the op-amp, and the control of the PCB layout to reduce differentials between op amp-inputs, effectively diminishes any reduced circuit performance due to heat. Further, high sensitivity in the circuit is effectuated via the placement of the guard bands and ground planes and the use of buried capacitance.

Furthermore, by using laminate capacitors, recognizing the desire to achieve the smallest RC time constant possible while still maintaining device stability, and using great care in the layout to minimize stray capacitive losses, improved response speed to a change in flame status can be achieved. The response speed of a flame sensor is an important factor in the detection of the lean blowout oscillatory behavior of a flame. Lean blowout behavior is defined as the point in which the ratio of the amount of air supplied to the amount of fuel supplied is so large that a self-sustaining combustion process can no longer continue. When lean blowout behavior exists, a certain oscillatory signature of the flame can be detected. The detection of the signature could prevent flashback, which can be harmful to combustion equipment.

FIGS. 14–17 are exemplary views of a flame sensor assembly consistent with the invention, including housing 102, circuitry 104, and electrical connector 100.

Although the present invention has been set forth in terms of the embodiments described herein, it is to be understood that such disclosure is purely illustrative and is not to be interpreted as limiting. Consequently, without departing from the spirit and scope of the invention, various alterations, modifications, and/or alternative applications of the invention will, no doubt, be suggested to those skilled in the art after having read the preceding disclosure. Accordingly, it is intended that the present invention be interpreted as encompassing all alterations, modifications, or alternative applications as fall within the true spirit and scope of the invention.

What is claimed is:

1. A UV flame sensor comprising electronic circuitry formed on a multi-layer Printed Circuit Board (PCB), said electronic circuitry including:
   a photodiode detecting an input signal;
   an amplifier amplifying said input signal and providing an output signal;
   a transistor providing automatic gain control; and
   at least one capacitor providing stability to the output signal of the amplifier;
   wherein said capacitor is formed from a capacitance laminate buried in said PCB, and said flame sensor further comprises at least one guard band on each layer of the PCB, wherein said guard bands are disposed at substantially identical positions in each said layer of the PCB.

2. The UV flame sensor of claim 1, wherein the sensor is adapted to operate at temperatures of up to 125° C.

3. The UV flame sensor of claim 1, wherein the PCB has at least one interior layer.

4. A UV flame sensor comprising electronic circuitry formed on a multi-layer Printed Circuit Board (PCB), said electronic circuitry including:
   a photodiode detecting an input signal;
   at least one capacitor providing stability to the output signal of the amplifier; and
   wherein said capacitor is formed from a capacitance laminate buried in said PCB, and said flame sensor further comprises at least one guard band on each layer of the PCB, wherein said guard bands are disposed at substantially identical positions in each said layer of the PCB.

5. The UV flame sensor of claim 1, further comprising a low pass filter.

6. The UV flame sensor of claim 1, wherein the guard bands on each said layer of the PCB are substantially identically shaped.

7. The UV flame sensor of claim 4, wherein the tracks on each said layer of the PCB are substantially identically shaped.

8. The UV flame sensor of claim 1, wherein said sensor has a response time of less than 25 milliseconds.

9. A UV flame sensor comprising:
a housing; and
electronic circuitry formed on a multi-layer PCB and disposed within said housing;
wherein said circuitry includes:
a photodiode detecting an input signal through said lensing;
an amplifier amplifying said input signal and providing an output signal;
a transistor providing automatic gain control; and
wherein said capacitor is formed from a capacitance laminate buried in said PCB, and the PCB has at least one interior layer, and said flame sensor further comprises tracks of equal potential disposed at substantially identical locations on each of the interior layers of the PCB.

10. The UV flame sensor of claim 9, wherein the sensor is adapted to operate at temperatures of up to 125° C.

11. The UV flame sensor of claim 9, wherein the PCB has at least one interior layer.

12. A UV flame sensor comprising:
a housing; and
electronic circuitry formed on a multi-layer PCB and disposed within said housing;
wherein said circuitry includes:
a photodiode detecting an input signal through said lensing;
an amplifier amplifying said input signal and providing an output signal;
a transistor providing automatic gain control; and
at least one capacitor providing stability to the output signal of the amplifier; and
an amplifier amplifying said input signal and providing an output signal;
a transistor providing automatic gain control; and
at least one capacitor providing stability to the output signal of the amplifier;
wherein said capacitor is formed from a capacitance laminate buried in said PCB, said flame sensor wherein the PCB has at least one interior layer, and said flame sensor further comprises tracks of equal potential disposed at substantially identical locations on each of the interior layers of the PCB.

13. A UV flame sensor comprising:
a housing; and
electronic circuitry formed on a multi-layer PCB and disposed within said housing;
wherein said circuitry includes:
a photodiode detecting an input signal through said lensing;
an amplifier amplifying said input signal and providing an output signal;
a transistor providing automatic gain control; and
at least one capacitor providing stability to the output signal of the amplifier; and
wherein said capacitor is formed from a capacitance laminate buried in said PCB, and said flame sensor further comprises at least one guard band on each layer of the PCB, wherein the guard bands on each said layer of the PCB are substantially identically shaped.

14. The UV flame sensor of claim 12, wherein the tracks on each layer of the PCB are substantially identically shaped.

15. The UV flame sensor of claim 9, further comprising a low pass filter.

16. The UV flame sensor of claim 9, wherein the sensor has a response speed of less than 25 milliseconds.

17. A method for producing a UV flame sensor, said method comprising:
fabricating a PCB with at least three layers, at least one of said layers being an interior layer, and said layers having guard bands, ground planes, and tracks;
placing the guard bands in identical positions on each said layer of the PCB;
mimicking tracks of equal potential on the interior layers of the PCB;
burying a capacitance laminate on the interior layers of the PCB;
disposing on said PCB a photo diode for detecting an input signal, an amplifier for amplifying said input signal and providing an output signal, and a transistor providing automatic gain control; and
using the capacitance laminate buried on the interior layers of said PCB to form at least one capacitor so as to provide stability to the output signal of the amplifier.

* * * * *